United States Patent [19]

Glaeser et al.

[11] Patent Number: 4,914,721

[45] Date of Patent: Apr. 3, 1990

[54] SAFETY DEVICE

[75] Inventors: Karl C. Glaeser; Gerhard Buhr, both of Leverkusen; Joachim Cardinal, Bergisch-Gladbach; Klaus Genuit, Aachen; Detlef Lohmüller, Bonn; Heinz Tilmans, Burscheid, all of Fed. Rep. of Germany

[73] Assignee: Ernst Peiniger GmbH Unternehmen fuer Bautenschutz, Fed. Rep. of Germany

[21] Appl. No.: 266,483

[22] Filed: Nov. 2, 1988

Related U.S. Application Data

[63] Continuation of Ser. No. 123,424, Nov. 20, 1987, Pat. No. 4,814,632.

[30] Foreign Application Priority Data

Nov. 20, 1986 [DE] Fed. Rep. of Germany ....... 3639628
Dec. 17, 1986 [DE] Fed. Rep. of Germany ....... 3643060

[51] Int. Cl.$^4$ .............................................. H02H 3/16
[52] U.S. Cl. ................................... 307/116; 307/115; 340/573; 192/129 A; 192/131 R; 200/DIG. 2; 2/160; 361/175; 455/600
[58] Field of Search ........................ 307/114, 115, 116; 192/129 A, 131 R, 134; 2/162, 161 R, 163, 167, 168, 169, 161 A, 16, 17, 20, 160, 158; 200/DIG. 2; 340/575, 576, 573, 582, 566, 531, 532, 530, 539, 562; 361/179, 180, 175, 181, 182, 183, 184, 189, 232, 218, 224; 116/205; 381/41, 42, 43, 45; 364/516.13; 455/600, 606, 607; 51/310, 410, 418, 429, 436, 424, 438, 427, 425, 439; 239/530, 576, 586, 526; 137/614.2, 462, 519.5

[56] References Cited

U.S. PATENT DOCUMENTS

| 3,034,263 | 5/1962 | McDaniel et al. | |
| 3,370,233 | 2/1968 | Morelock | 2/160 |
| 3,784,842 | 1/1974 | Kremer | 340/573 X |
| 4,195,722 | 4/1980 | Anderson et al. | 192/131 R |
| 4,321,841 | 3/1982 | Felix | 192/131 R X |
| 4,479,571 | 10/1984 | Eliot | 192/129 A |
| 4,520,257 | 5/1985 | Schwob et al. | 219/250 |
| 4,586,387 | 5/1986 | Morgan et al. | 2/160 |
| 4,621,300 | 11/1986 | Summerer | 200/DIG. 2 |
| 4,635,516 | 1/1987 | Giannini | 2/160 |
| 4,648,131 | 3/1987 | Kawaguchi et al. | 340/573 |
| 4,649,374 | 3/1987 | Hoigaard | 340/573 |
| 4,673,798 | 6/1987 | Contri et al. | 219/251 X |
| 4,686,352 | 8/1987 | Nawrot et al. | 219/257 X |

FOREIGN PATENT DOCUMENTS

| 2219514 | 10/1973 | Fed. Rep. of Germany . |
| 3025895 | 2/1982 | Fed. Rep. of Germany . |
| 8526106 | 5/1986 | Fed. Rep. of Germany . |
| 8613771 | 9/1987 | Fed. Rep. of Germany . |
| 2341806 | 9/1977 | France . |
| 1564099 | 3/1979 | France . |
| 584981 | 2/1977 | Switzerland . |
| 644489 | 1/1979 | U.S.S.R. . |
| 710548 | 1/1980 | U.S.S.R. . |
| 700751 | 12/1953 | United Kingdom . |

Primary Examiner—William M. Shoop, Jr.
Assistant Examiner—Paul Ip
Attorney, Agent, or Firm—Browdy and Neimark

[57] ABSTRACT

A safety device for an apparatus to be manipulated by an operator. The apparatus is connected via a supply line for a supply means to a supply means source. A handgrip is provided to be grasped by the operator for controlling the operation of the apparatus. An operating sensor is actuated by the operator and is connected to the control device. The operating sensor may be an electric proximity switch provided so that it is possible to shut off the apparatus when the operator ceases to actuate the operating sensor. The operating sensor, or at least one indiciator element of the operating sensor, is disposed on the hand of the operator, particularly integrated into a protective glove for the hand of the operator.

17 Claims, 4 Drawing Sheets

SAFETY DEVICE

This is a continuation of application Ser. No. 123,424 filed Nov. 20, 1987 Pat. No. 4,814,632.

FIELD OF THE INVENTION

The invention relates to a safety device for an apparatus used by an operator, the apparatus to be used by an operator being connected to a power supply via a supply line, comprising a handgrip grasped or enfolded by the operator, where the operation of the apparatus is preferably controllable from the power source, with a control device for the control of the operation of the apparatus and with an operating sensor disposed on the apparatus, which is actuated by the operator and preferably connected with the control device via a cable, the operating sensor being designed as an electronic proximity sensor, preferably operable contact-free, which is preferably actuated by a special actuation element, particularly a foil, preferably aluminum, copper, a material of low magnetic retentivity with high initial permeability, such as Mumetal or the like, and where the apparatus can be switched off when the action on the operating sensor by the operator stops.

BACKGROUND OF THE INVENTION

A safety device of the type discussed is recommended for all types of apparatus used by an operator, in order to protect the operator against accidents or to avoid unsupervised operation of the apparatus used by the operator. A safety device of this type is recommended, for example, for a grinder, milling machine or the like, as well as for a water or foam type fire extinguisher of a fire fighting device, an acetylene torch, a spray head for paint work or metal die casting, etc. Such a safety device is of particular importance for a sandblasting device of a sandblasting unit for pressure sandblasting—dry blasting, moist blasting, wet blasting—where such a safety device acting, so to speak, as a deadman's switch is required by safety regulations. Without intending to limit of the filed of application of a safety device of the type discussed, this safety device is primarily explained below by means of the example of a sandblasting device.

In a known safety device for an apparatus to be manipulated by an operator (DE-U 86 13 771), particularly intended and usable for a sandblasting device of a sandblasting unit, where the device to be manipulated by the operator is connected via a supply line for a supply means, in this case compressed air, to a supply source, the operation of the device is controlled from the supply source. A control device is provided on the supply means source, by means of which the input of the supply means can be controlled. The control device is actuated by an operating sensor disposed on a handgrip of the device. The operating sensor is connected via a cable to the control device. When the actuation of the operating sensor by the operator ceases, the device is switched off.

The operating sensor of the known safety device is designed as an electronic proximity sensor, preferably operable contact-free, which is preferably actuated by a special actuation element, particularly a foil. Besides the operating sensor the device is further provided with a normmal operating unit for remote operation of the device. This normal operating unit has a plurality of activating elements for differing functions.

In the previously described known safety device there is furthermore provided a relief device for the supply line for the purposes of switching off the device as quickly as possible. This relief device is disposed at a point in the supply line distant from the device near the connection of the supply line to the supply means source. It has a relief cross section which approximately corresponds to the flow cross section of the supply line. A shut-off device for the supply line is associated with the relief device, the two devices being locked off from each other in terms of circuitry.

In the known safety device it is considerably more difficult to bypass the operation sensor than, for example, the mechanical hand lever of a deadman's switch or the like. However, a bypass is not impossible. Finally, although in the known safety device the reverse relief of the supply line, which is important for reasons of safey, is beneficial in its effects, it entails great expenditures for construction and the prevention of wear, especially if highly abrasive sandblasting means are used in a supply line.

SUMMARY OF THE INVENTION

It is an object of the invention to improve the known safety device such that a bypass of the operating sensor becomes for all practical purposes impossible and that the supply line is optimally shut off upon sensor response.

This object is attained in a safety device for an apparatus used by an operator according to the present invention in that the operating sensor or at least one indicator element of the operating sensor is disposed on the hand of the operator, in particular that it has been integrated into a protective glove for the hand of the operator. Because of the fact that the operating sensor is provided on the hand of the operator, bypassing of the safety device or of the operating sensor is totally impossible, since the device itself is only passive. Without the operating sensor associated with the hand of the operator, operation of the device is systematically impossible.

Furthermore, the object described above is also attained from the viewpoint of safety by the characteristic that the supply line can be compressed at least in the area of the relief device and/or the shut-off device, and that the relief device and/or the shut-off device, or both, each have a movable compression element. The provision of the relief device and/or the shut-off device as compression elements is particularly simple and sturdy and results in an optimal adaptation to the technical requirements even and especially with the use of highly abrasive sandblasting means as supply means.

There are many ways to design the safety device according to the invention in a practical manner and to improve it. This is illustrated by means of the drawings in connection with the ensuing description of a preferred exemplary embodiment of a sandblasting unit equipped with a safety device of the invention.

DETAILED DESCRIPTION OF THE PREFERRED EMBODIMENT

Figure 1:
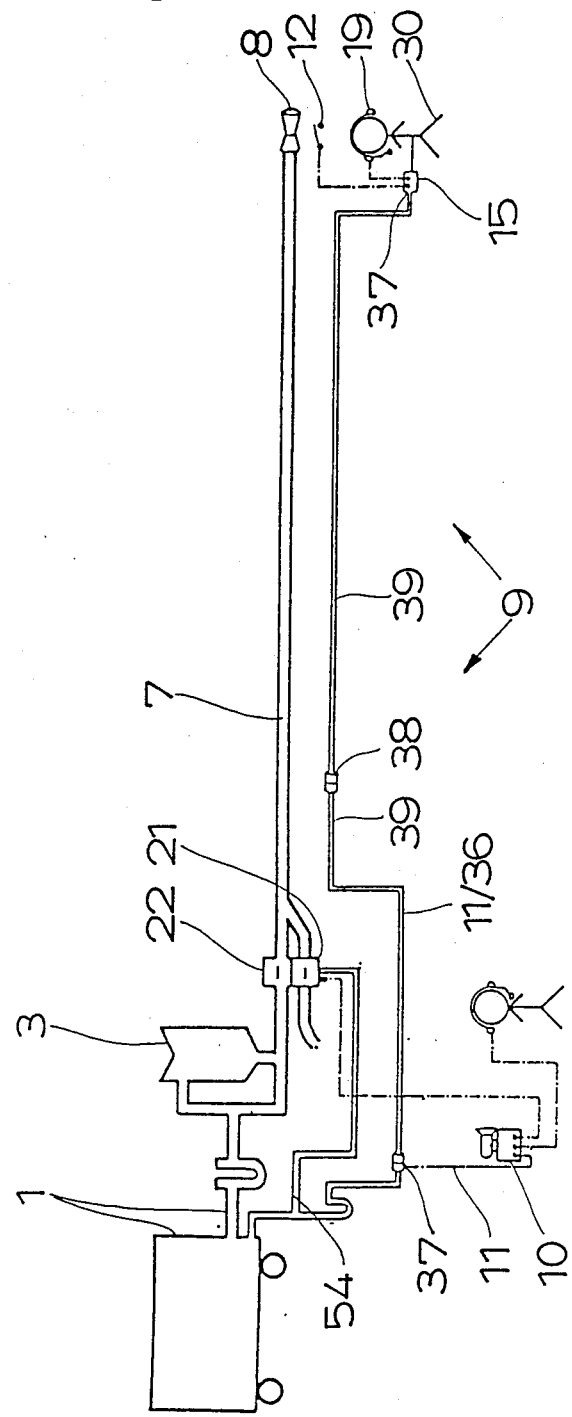
FIG. 1 is a schematic view of an exemplary embodiment of a sandblasting unit for compressed air blasting.

It should be mentioned beforehand that, instead of the sandblasting unit for compressed air blasting shown in FIG. 1, other devices may be used, for example a foam-type fire extinguishing unit as previously mentioned in the present description. The sandblasting unit shown in FIG. 1 has a compressed air line 1 connected to a supply means source 3, in this case in the form of a usual sandblasting supply container. From a connector of the sandblasting supply container 3 a supply line 7 leads to a device 8 which is manipulated by an operator 30. In the exemplary embodiment shown here the supply line 7 is a line for compressed air and blasting sand, and the apparatus 8 is a sand blaster or blast nozzle.

The sandblasting unit shown in FIG. 1 is provided with a safety device 9 for the apparatus 8 which is manipulated by the operator having a control device 10 for controlling the operation of the apparatus 8 as well as an operating sensor 12 provided on the apparatus 8 which is actuated by the operator and which is connected with the control device 10 via a cable 11. The apparatus 8 can be switched off when the action on the operating sensor 12 by the operator 30 stops.

Figure 2:
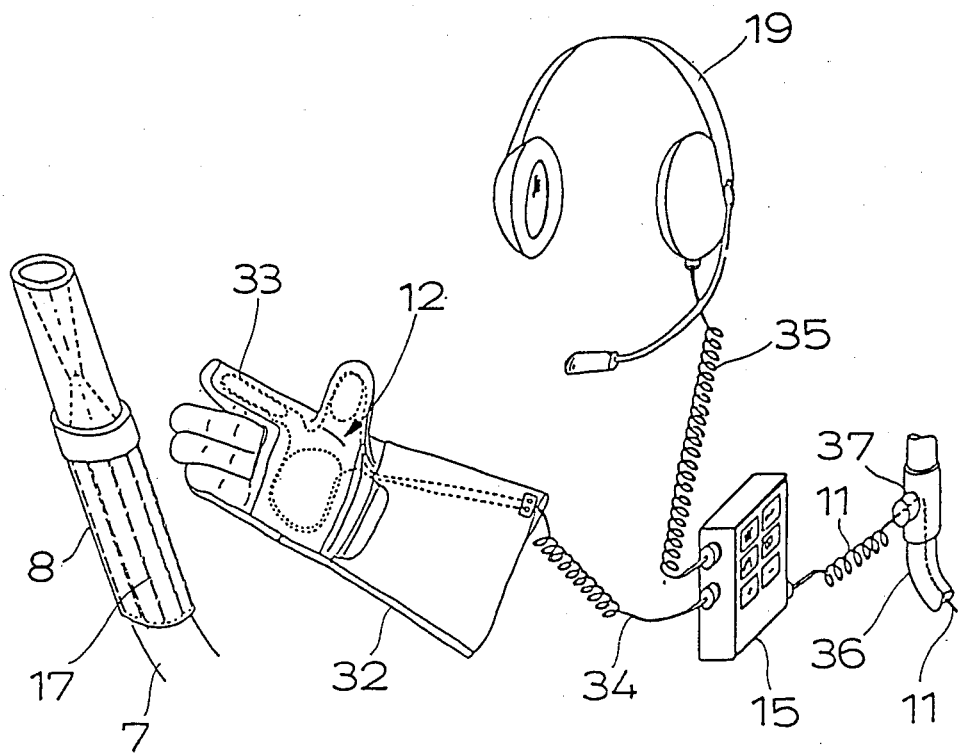
FIG. 2 is a schematic view of the area of a device of a sandblasting unit in accordance with claim 1, to be manipulated by an operator.

As shown in FIG. 1 in combination with FIG. 2, the operating sensor 12 is inconspicuously placed in the exemplary embodiment shown here. This is made possible by the operating sensor 12 being embodied as an electronic proximity sensor which preferably can be actuated contact-free. In general such a proximity sensor can be actuated inductively capacitively, optically, thermically or acoustically, and this will be further explained below. Furthermore, reference is made to the voluminous technical literature in connection with electronic proximity switches, preferably those actuable in a contact-free manner.

It is further suggested in FIG. 1 that beside the operating sensor 12 a normal actuating unit 15 for remote control of the apparatus 8 has been provided. Such a normal actuating unit 15 is used for the normal operation of the apparatus 8 while the operating sensor 12 is used more for emergency operation, particularly in connection with a deadman's switch. A normal actuation unit 15 can have normal operating elements, for example, for the functions of sandblasting means on/off, compressed air on/off, additives on/off, and so forth. FIG. 2 shows that such a normal actuating unit 15 can be disposed physically separate from the apparatus 8, on a belt worn by the operator 30.

FIGS. 1 and 2 further show that the apparatus 8 has a handgrip 17, which is to be grasped or enfolded by the hand of the operator 30, and that an intercom 19 is provided here, in accordance with the preferred teachings. The normal actuating unit 15 on the belt of the operator 30 serves simultaneously as a local central control unit and includes the intercom 19.

Finally it is suggested in FIG. 1 that at a location of the supply line 7 remote from the apparatus 8, namely at a place close to the connection of the supply line 7 with the supply means source 3, there is provided a relief device 21 for the supply line as well as, and also in accordance with the preferred teaching, a shut-off device 22 for the supply line 7. The relief device has a relief cross section which approximately corresponds to the flow cross section of the supply line 7, so that a quick and effective relief in the reverse direction can take place. In the concretely shown exemplary embodiment the supply line 7 can, for example, have a diameter of 42 mm, i.e. have a flow cross section of approximately 1,330 mm$^2$. The relief device 21 would then also have this diameter. In a supply line of 400 m length, relief only takes a few seconds, clearly less than 5 sec. At the same time it can be assured by means of the shut-off device 22, with the locking of the relief device 21 and the shut-off device 22 that is provided, that no further supply means will flow from the supply means source 3.

In the exemplary embodiment of a sandblasting unit shown in FIGS. 1 and 2 as an example of such a unit in general, the operating sensor 12, here more exactly an indicator element of the operating sensor 12, is disposed on the hand of the operator 30. In the preferred exemplary embodiment shown here the indicator element of the operating sensor 12 has been integrated into a protective glove 32 for the hand of the operator 30. In the exemplary embodiment particularly clearly shown in FIG. 2 the indicator element of the operating sensor 12 is an air coil 33 which has been integrated here into the palm of the protective glove 32. The air coil 33 is connected in the exemplary embodimemt shown here with a central electronic device or electronic triggering device via a connecting cable 34, which will be described in more detail below. Plug or button contacts are indicated in the area of the wrist of the protective glove 32. In the preferred exemplary embodiment here shown the air coil is distributed flat across the palm and up into the index finger and thumb of the protective glove 32. The main point is that it is particularly practical if the indicator element is disposed in the palm of the protective glove 32 at a point maximally free of movement, particularly between thumb and index finger. However, the indicator element does not have to have the wide expanse concretely shown in FIG. 2. This results in a further safety measure, namely that grasping the apparatus 8 with the bare hand does not result in actuating the operating sensor 12, and thus the operator 30 is forced to wear the protective glove 32 at work. This results in the advantage that bypassing the operating sensor 12 and nullifying the safety effect of the safety device 9 of the invention is extremely difficult for the average operator 30. Since the operating sensor 12 is associated with the protective glove 23, i.e. with the operator 30, bypassing the safety device 9 is impossible, simply because the apparatus 8 itself is only passive. If the operating sensor 12 and particularly its indicator element can only be activated by a special actuator element, then it is suggested to dispose the actuator element on the apparatus 8 in the present exemplary embodiment, and in particular to integrate it flat into the surface of the apparatus 8. This has only been sketched in in FIG. 2. A point in particular is that, for example, the foil forming the actuator can be wound or glued around a nozzle, a nozzle holder or the supply line 7 itself. Another point is that the actuator element can be integrated, particularly by vulcanizing, into a rubber hose, for example, which is attached to the apparatus 8 at a suitable spot. It is especially recommended to integrate the actuator element into the handgrip 17, preferably of course into the gripping surface of the handgrip 17.

Previously it has already been briefly discussed that the electronic and preferably contact-free operable proximity switch of the invention can be operated as operating sensor by inductive, capacitive, optical, thermal or like means by the operator. Besides the embodiment as an inductive proximity switch previously thoroughly discussed, a number of further embodiments are to be discussed which have not been shown in the drawings.

First, it could be recommended to provide the operating sensor in the form of a capacitative proximity sensor. The hand of the operator could then, for example, cause the actuation of the response capacity of the capacitative proximity sensor.

A further alternative is also to provide the operating sensor in the form of a magneto-elastically operating sensor. For example, the magneto-elastic effect of such a sensor could be utilized during the grasping of a handgrip and the change of the mechanical load on a protective glove of an operator connected therewith.

Similarly to a magneto-elastically operating sensor, a sensor operating piezo-electrically could be provided. In this case the mechanial work would be translated into electric voltage.

In accordance with another alternative, the operating sensor could be provided as a wire strain gauge sensor, particularly with a least one semiconductor wire strain gauge. Such wire strain gauge sensors can be cheaply and practically used, especially when using modern semiconductor technology.

Of particular importance is a further teaching of the invention characterized by providing the operating sensor as a sound sensor, preferably a structure-borne sound sensor, particularly a structure-borne sound microphone. Because of the susceptibility to interference of a sound sensor reacting to sound transmitted through the air, a structure-borne sound sensor is provided here in a particularly preferred way. Often a microphone specially tuned to structure-borne sound and structure-borne sound measurement is used. Such sensors are known from the technical literature. The supply means exiting the apparatus, particularly the sandblasting material carried by air pressure in a sandblasting unit, generates high-frequency oscillations in the apparatus, particularly in the nozzle body of the sandblasting unit. Now if, for example, a structure-borne sound microphone has been integrated into a work glove of an operator and is connected to the control device, this structure-borne sound microphone registers the structure-borne sound in the nozzle body whenever, and only whenever, the work glove tightly surrounds the handgrip of the nozzle body. This technique makes it unnecessary to adapt the apparatus itself in any manner.

The only possible way to circumvent the operating sensor described above, in particular a structure-borne sound sensor, is to impose on it the structure-borne sound frequencies occurring in the operation of the apparatus itself. In order to provide a special level of protection against outside influence here, it is recommended that the control device have at least one frequency filter associated with the sound sensor. A frequency filter in the control device can be embodied, for example, as either a low-pass, high-pass or band-pass filter. It is also possible to connect several frequenccy filters in parallel in order to selectively determine different frequencies normally occurring during operation of the apparatus. Specific frequencies can also be filtered out with such frequency filters (set-point sound).

In the previously discussed safety installation and sound sensor, not only is there a determination whether the operator is actually actuating the operating sensor, but it is determined at the same time whether or not the apparatus is operating. Although this is advantageous, it means a special provision must be made during the start-up of the apparatus, when there is no sound or structure-borne sound yet. In this case it is recommended that the control device be provided with a bypassing switch and that it be possible to bypass while the apparatus to be manipulated by the operator is starting up, until the corresponding set-point sound occurs. It can be provided in the design of the circuit that the bypassing switch in the control device is automatically opened as soon as a set-point signal, indicating actuation by the operator and the operation of the apparatus, has been generated.

It has not been shown in the drawings that a delay switch can be associated with the operating sensor if this is considered practical given the circumstances of use. Also not shown in the drawings is that the operating sensor, as already mentioned, can be provided in the form of a proximity sensor only actuated by a special actuator element, particularly a foil, preferably of aluminum, copper, a material of low magnetic retentivity with high initial permeability, such as Mumetal or the like. Mumetal or materials with high initial permeability as they are known, for example, for use in magnetic screens, are suitable to a particular degree, since in this way metals such as steel, aluminum, zinc, copper or the like cannot interfere with the operating sensor. Accidental interference can therefore by safely prevented.

Finally, FIG. 2 shows that in the exemplary embodiment shown therein the electronic control associated with the indicator element of the operating sensor 12 can be integrated into the normal actuating unit 15. Furthermore, FIG. 2 also shows that the intercom 19 is connected via a cable 35 with the normal actuating unit 15.

Special attention is required for the connection via a cable 11 of the control device 10 to the apparatus 8 or to the operator 30. The cable 11 can be divided, one part carrying the current supply for the operator 30 and the other part transmitting the signals. Of course, by use of the corresponding filter techniques, single cables 11 can also be used. A particular problems lies in protecting the cable 11 against damage. In this respect FIG. 2 in combination with FIG. 1 shows a particularly preferred exemplary embodiment in that in this case a a ventilating air line 36 has been provided between the supply means source 3, or pressure generator, and the operator 30 and the cable 11 for the connection of the control device 10 with the apparatus 8 is disposed on the inside of the ventilating air line 36. This integration of the cable 11 and the ventilating air line 36, required in any case for protecting the breathing of the operator 30, guarantees a particularly protected way to bring the cable 11 to the operator 30. If a ventilating air line 36 per se is not present, the cable 11 can, of course, be integrated with other lines present, for example the supply line 7 or, more practically with an auxiliary air line perhaps extending parallel to the supply line 7. As far as the following explanation of the integration into the ventilating air line 36 is concerned, this is also correspondingly true for the integration into other lines.

In the exemplary embodiment explained above, naturally the ventilating air line 36 should have a cable connector 37 or cable lead-in in the vicinity of the control device 10 and in the vicinity of the apparatus 8, respectively. Such a cable connector 37 can be in the form of a plug-in connection in a plurality of different ways. If embodied as a cable duct or cable lead-in, a discrete connecting element is not necessary. However, sealing of the led-in or ducted cable 11 is then required. In general, the state of the art should be considered in respect to the construction of such connectors or lead-ins.

Figure 4:
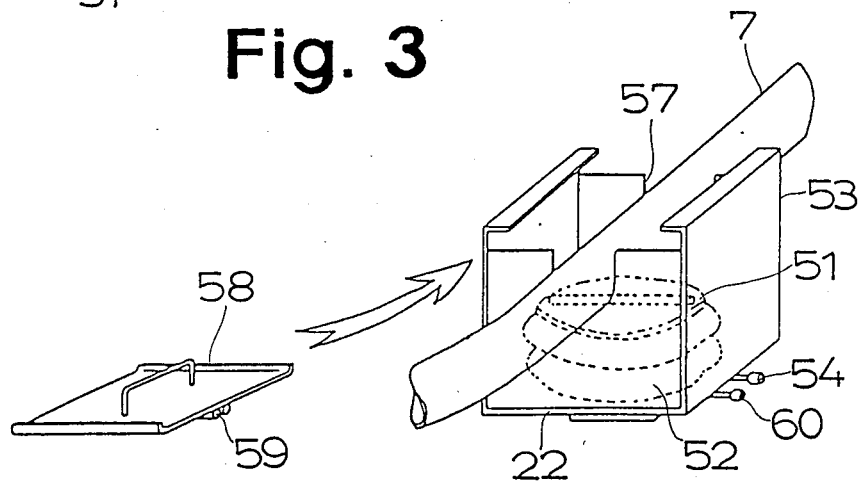

FIG. 1 shows a particular layout, in that here the ventilating air line 36, or any other line, comprises separate line segments 39 which can be connected by means of connecting elements 38, the connecting elements 38 at the same time serving as pneumatic connections of the line segments 39 and as the electrical connection of individual cable segments of the cable 11. FIG. 4 shows this schematically for two line segments 39.

As far as the relief device 21 and the shut-off device 22 are concerned, FIG. 1 shows these only schematically as shut-off elements. Such shut-off elements are in the form of ball-cock valves, slide valves, or the like.

However, FIGS. 3, 4 and 5a–5d show particularly preferred embodiments of a relief device 21 for the supply line 7, and of a shut-off device 22, which are particularly simple and sturdy. The exemplary embodiments shown here require that the supply line 7 is compressible, at least in the area of the relief device 21 and-/or the shut-off device 22. This is true for the supply line 7 itself as well as for relief connector 50 brought through the relief device 21. It is important in all cases that the relief device 21 and/or the shut-off device 22, or both, each have one movable compression element 51 for compressing the corresponding supply line 7 or the relief connector 50. In the preferred exemplary embodiment here shown, the compression element 51 can be moved by a pneumatic or hydraulic drive, particularly by a bellows cylinder 52.

Figure 3:
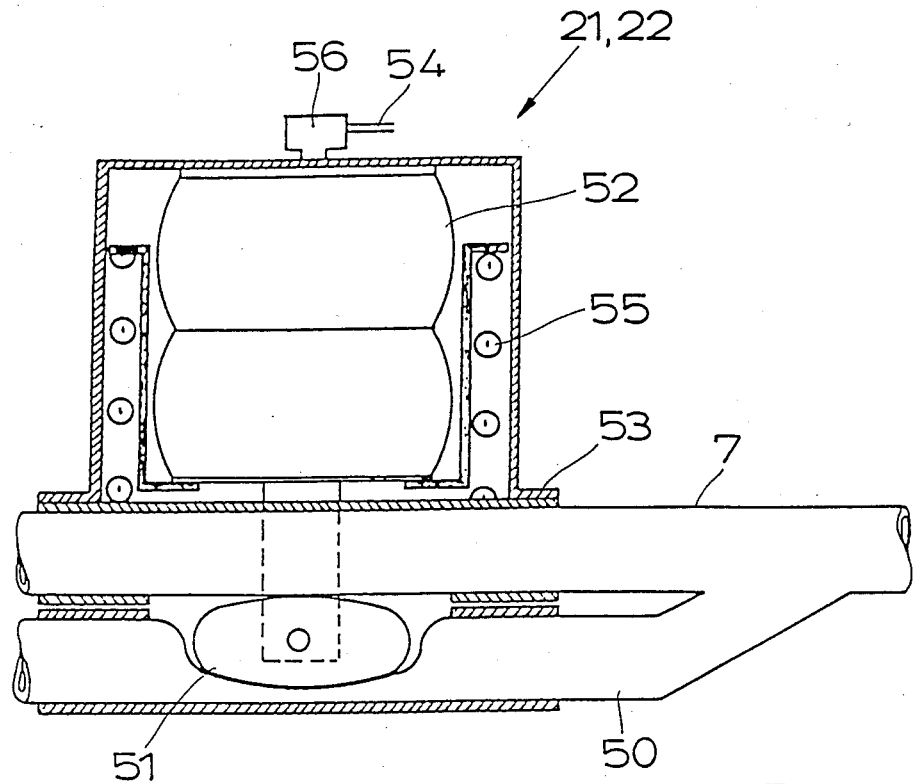
FIG. 3 is a detail of the sandblasting unit of FIG. 1 by way of example and in enlargement, FIG. 4 a detail similar to FIG. 3 in another embodiment.

The preferred embodiment shown in FIG. 3 has a supply line 7 and a relief connector 50 extending side by side and parallel to each other. A compression element 51 is disposed between the supply line 7 and the relief connector 50 in a housinng 53, surrounding the relief device 21, the shut-off device 22, the supply line 7 in this area, the relief connector 50 in this area and the compression element 51. By means of the propulsion by the bellows cylinder 52 shown here, which is actuable pneumatically, i.e. via a control pressure line 54, the compression element 51 of FIG. 3 can either be moved downward for opening the supply line 7 and closing the relief connector 50, or upwards for relief, i.e. the opening of the relief connector 50 and the closing of the supply line 7. The drive thus works in two directions. This is attained in the preferred exemplary embodiment shown here by the provision, in opposition to the direction of action of the bellows cylinder 52, of a spring 55 embodied as a helical pressure spring, which normally tries to compress the bellows cylinder 52 and moves the compression element 51 in the device here shown in the direction of the state of relief. The supply line 7 is therefore open and the relief connector 50 closed only when the bellows cylinder 52 is under pressure, if the control pressure falls off, the spring 55 upwardly compresses the bellows cylinder of FIG. 3 and in this way compresses the supply line 7.

FIG. 1 shows in connection with the above explanation that the control pressure line 54 for the relief device 21 and the shut-off device 22 can be readily connected to a common compressed air generator, with which, for example, the compressed air line 1 associated with the supply means source 3 is also connected. For the purpose of controlling the bellows cylinder 52, FIG. 3 additionally shows a control valve 56 on the control pressure line 54 which, in the exemplary embodiment shown here, can be provided as a simple 3/2-way valve.

The further exemplary embodiment of the teachings previously explained in principle shown in FIGS. 4 and 5a–5d, first also has a compression element 51 and a bellows cylinder 52 as a pneumatic drive. This exemplary embodiment, described by means of FIG. 4 for the shut-off device 22 of the supply line 7 is distinguished by great simplicity and excellent retrofitting ability for existing supply lines 7. The housing 53 is here made in the shape of a box with lateral walls and front and back walls, the front and back walls each having approximately U-shaped recesses on their upper edges for receiving the supply line 7. The supply line 7 can be inserted from above into these recesses 57. As shown by FIG. 4, the housing 53 is then closed by a sliding lid 58 which in the inserted state is prevented by holding flanges on the housing 53 from upwardly lifting off the housing 53. With the compression element 51 on the bellows cylinder 52, which here is provided as a compression strip extending crosswise to the supply line 7, is associated a corresponding compression element 59 on the inside of the lid 58. If during operation and with the supply line 7 inserted compressed air is fed via the control pressure line 54, also present here, to the bellows cylinder 52, the later expands, lifts the compression element 51 upwardly and thus compresses the supply line 7 between the compression elements 51 and 59. Furthermore, a pressure relief line 60 for the bellows cylinder 52 is also shown. A control valve, not shown, for example a 4/2-way control valve, can be connected to the lines 54, 60.

Figure 5A:
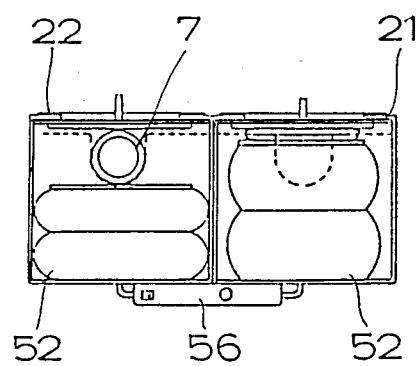
FIGS. 5a–5d are views of the area of the sandblasting unit of FIG. 1 shown in FIG. 4 in various functional states.
Figure 5B:
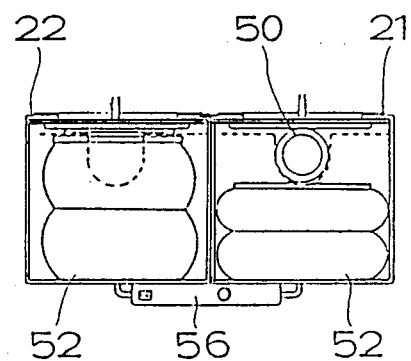
Figure 5C:
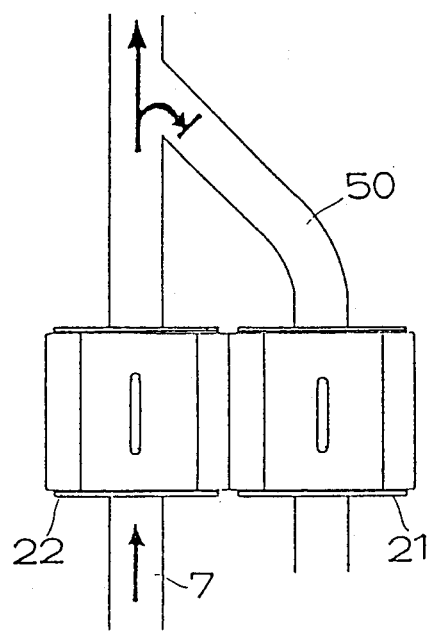
Figure 5D:
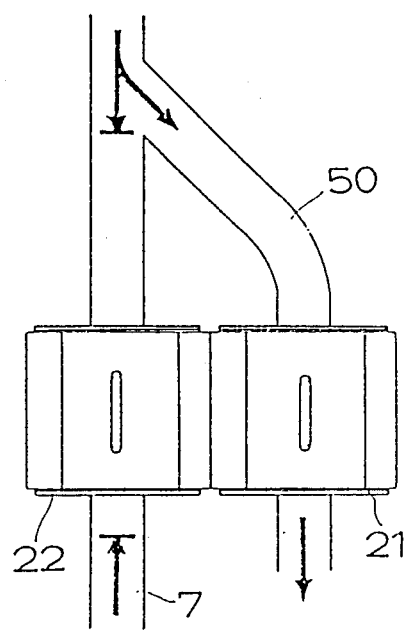

In a clearly comprehensible way the cooperation of a relief device 21 and a shut-off device 22, both constructed in accordance with the system of FIG. 4, is shown in FIGS. 5a–5d. The two bellows cylinders 52 which in the exemplary embodiment shown here constitute the drive for the compression elements 51, are connected to each other and to a control pressure line, not shown, via a control valve 56, here embodied as a 5/2-way valve, such that in case of a 1/0 signal, one of the two bellows cylinders 52 is always extended and the other of the two bellows cylinders 52 is always compressed. FIGS. 5a and 5c show the normal operating condition with the supply line 7 open and the relief connector 50 compressed, the direction of flow being shown at the lower left of FIG. 5. FIGS. 5b and 5d 5 the relief position is shown with the supply line 7 compressed and the relief connector 50 open, the directions of flow again in the lower right. This technology is especially practical and an existing system can be retrofitted easily. The design of the drives in the form of bellows cylinders 52 is sturdy and requires little maintenance, especially since the bellows cylinders 52 are protected against damage by the housing 53 in the present exemplary embodiment. The pneumatic control from the source of compressed air via the control pressure line is typical for the system and thus is particularly practical.

It is to be understood that the description of the exemplary embodiments has been given by way of example only and that further improvements and variants are possible within the scope of the invention.

What is claimed is:

1. A safety device for an apparatus connected to a power supply via a supply line, said apparatus to be used by an operator, said apparatus comprising:
   a handgrip grasped by the operator;
   a power source controlling the operation of the apparatus;
   a control device for control of the operation of the apparatus;
   an electronic operating sensor disposed on the apparatus and having one electronic sensing element;
   said operating sensor actuated by the operator;
   said operating sensor being actuated by an actuating element, this actuating element being completely separate from said operating sensor;
   said apparatus being switched off when the operator's action on the operating sensor stops;
   at least said electronic sensing element of said operating sensor being disposed on the hand of the operator; and
   said actuating element being the handgrip as such or some special element disposed on said handgrip, particularly a foil forming said actuating element positioned on said handgrip.

2. The safety device acccording to claim 1 wherein said operating sensor or, at least, said electronic sensing element is integrated into a protective glove for the hand of the operator.

3. The safety device according to claim 2 wherein an induction loop is integrated into the palm of the protective glove.

4. The safety device according to claim 2 wherein an air coil is integrated into the palm of the protective glove.

5. The safety device according to claim 2 wherein at least said electronic sensing element in the palm of the protective glove is disposed at a location as free as possible of movement.

6. The safety device according to claim 5 wherein said operating sensor or said electronic sensing element is disposed between the thumb and index finger of the glove.

7. The safety device according to claim 1 wherein the actuating element is disposed on the apparatus and integrated flat into the surface of the apparatus.

8. The safety device according to claim 7 wherein the actuating element is integrated into the handgrip.

9. The safety device according to claim 8 wherein the actuating element is integrated into the gripping surface of the handgrip.

10. The safety device according to claim 1 wherein said operating sensor is a sound sensor.

11. The safety device according to claim 10 wherein said sound sensor is a structure-borne sound microphone.

12. The safety device according to claim 11 wherein the control device has at least one frequency filter associated with the structure-borne sound microphone.

13. The safety device according to claim 10 wherein the control device is equipped with a bypassing switch permitting the operating sensor to be bypassed during startup of the apparatus.

14. A safety device for an apparatus connected to a power supply via supply line, said apparatus to be used by an operator, said apparatus comprising:
   a handgrip grasped by the operator;
   a power source controlling the operation of said apparatus;
   a control device for control of the operation of the apparatus;
   wherein at a position in the supply line in the vicinity of the connection of the supply line to the power supply a relief device for the supply line is provided;
   said relief device for the supply line having a relief cross section approximately corresponding to a flow cross section of the supply line; and
   a shut-off device for the supply line is associated with the relief device for the supply line;
   the relief device and the shut-off device being blocked in relation to each other;
   wherein the supply line is compressible at least in the relief device and at least the relief device has a movable compression element.

15. The safety device according to claim 14 wherein the compression element is movable by means of a pneumatic or hydraulic drive.

16. The safety device according to claim 15 wherein the compression element is movable by means of a bellows cylinder.

17. The safety device in accordance with claim 1 wherein said actuating element disposed on said handgrip is a foil which forms the actuating element.

* * * * *